United States Patent [19]

Akamatsu et al.

[11] Patent Number: 4,590,534
[45] Date of Patent: May 20, 1986

[54] TUBES FOR INTEGRATED CIRCUITS

[75] Inventors: Yoshihiro Akamatsu, Tokyo; Tadashi Azuma, Kanagawa; Toshio Ishida, Tokyo, all of Japan

[73] Assignee: Fujimori Kogyo Co., Ltd., Japan

[21] Appl. No.: 706,668

[22] Filed: Feb. 28, 1985

[30] Foreign Application Priority Data

Aug. 27, 1984 [JP] Japan ................... 59-128583

[51] Int. Cl.⁴ ............................................. H05F 3/00
[52] U.S. Cl. ..................................... 361/212; 206/328; 361/220
[58] Field of Search ............... 361/212, 215, 220, 222, 361/230; 206/328

[56] References Cited

U.S. PATENT DOCUMENTS

| | | | |
|---|---|---|---|
| 4,327,832 | 5/1982 | de Matteo | 361/220 X |
| 4,463,851 | 8/1984 | Cecil | 361/220 X |
| 4,485,531 | 12/1984 | Murphy | 361/220 X |
| 4,487,315 | 12/1984 | Azuma | 206/328 X |
| 4,515,269 | 5/1985 | Hashimoto | 206/328 X |

Primary Examiner—Harry E. Moose, Jr.
Attorney, Agent, or Firm—Wegner & Bretschneider

[57] ABSTRACT

A tube for integrated circuits, which comprises:
an electrically conductive substrate sheet formed by laminating an electrically conductive thin layer onto at least one side of a transparent sheet of a synthetic resin, said substrate sheet being bent plural times in a parallel fashion to thereby form an upper section, left and right sections depending therefrom, left and right bottom sections and left and right upright sections spaced away from each other;
a covering member formed of left and right resting pieces for resting an integrated circuit thereon; and
an electrically conductive band-like lining sheet formed by laminating an electrically conductive thin layer onto at least one side of a transparent band-like sheet of a synthetic resin;
said lining sheet being fixedly bonded at both side edges to the lower faces of said resting pieces.

15 Claims, 5 Drawing Figures

TUBES FOR INTEGRATED CIRCUITS

FIELD OF THE INVENTION

The present invention relates to a novel tube for integrated circuits (hereinafter referred to as the IC tube(s)).

BACKGROUND INFORMATION OF THE INVENTION

Currently available opaque IC tubes are formed of aluminium by draw moulding or obtained by bending of plates of synthetic resins such as black polyethylene, polypropylene, polyvinyl chloride or the like which contain 10–30% by weight of carbon black. Conventional transparent IC tubes are obtained by incorporating an antistatic agent into transparent synthetic resins such as polyethylene, polypropylene, polyvinyl chloride, etc., followed by molding, or by molding the aforesaid synthetic resins and, thereafter, coating the thus molded bodies with an antistatic agent using a suitable solvent. With the black IC tubes, it is impossible to read markings on integrated circuits and, hence, to detect beforehand mis-packing of different integrated circuits. With the IC tubes incorporated therein and coated thereon with antistatic agents, on the other hand, the antistatic agents exposed to the surfaces thereof, or coated on the surfaces, esp., inner surface thereof peel off due to the friction with the bodies or terminals of integrated circuits, when they are packed or unpacked. Especially when the antistatic agents are deposited onto the terminals of integrated circuits, the setting of ICs to electronic equipment is hindered, and the electrostatic shielding effect of the IC tubes are substantially lost, in particular, at a low humidity, thus causing an electrostatic influence upon IC.

Some of the drawbacks as mentioned above are eliminated by the IC tubes disclosed in Japanese Patent Application No. 58-142166 specification. However, since an upper member forming a resting member is constructed of a double layer comprised of a resting plate and a seal-bonded tape, that tube is so poor in the light transmitting property that difficulty is encountered in reading markings on the inner face of the packed-in integrated circuit. This holds for even the case where the seal-bonded tape has a light transmitting property. Diffuculty is also involved in discriminating markings on the inner face of the integrated circuit, when the seal-bonded tape is colored, so that mis-packing of different ICs cannot be avoided beforehand. The contact of the entire inner face of the integrated circuit with the upper faces of the left and right resting plates also causes peeling-off of a large amount of the antistatic agent kneaded in or coated on the integrated circuit. Then, the powdery antistatic agent is deposited onto, esp., the terminal of IC, disturbing the incorporation of IC into the associated equipment, reducing the electrostatic shielding effect due to peeling of the antistatic agent from the coating, and causing an electrostatic influence upon IC.

SUMMARY OF THE INVENTION

A main object of the present invention is to eliminate the aforesaid drawbacks by providing a tube for integrated circuits comprising an electrically conductive substrate sheet formed by laminating an electrically conductive thin layer onto at least one side of a transparent sheet of a synthetic resin, said substrate sheet being bent plural times in a parallel fashion to thereby form an upper section, left and right sections depnding therefrom, left and right bottom sections and left and right upright sections spaced away from each other; a covering member formed of left and right resting pieces for resting an integrated circuit thereon; and an electrically conductive band-like lining sheet formed by laminating an electrically conductive thin layer onto at least one side of a transparent band-like sheet of a synthetic resin; said linining sheet being fixedly bonded at both side edges to the lower faces of said resting pieces.

BRIEF DESCRIPTION OF THE DRAWINGS

The foregoing and other objects and features of the present invention will become apparent from the following detailed description with reference to the accompanying drawings, which are given for the purpose of illustration alone, and in which.

EXPLANATION OF THE PREFERRED EMBODIMENTS OF THE INVENTION

Figure 1:
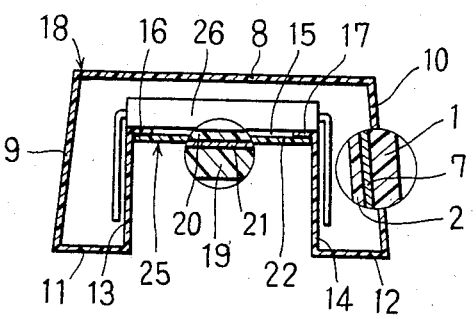
FIG. 1 is a partly enlarged section of one embodiment of the IC tube according to the present invention.
Figure 2:
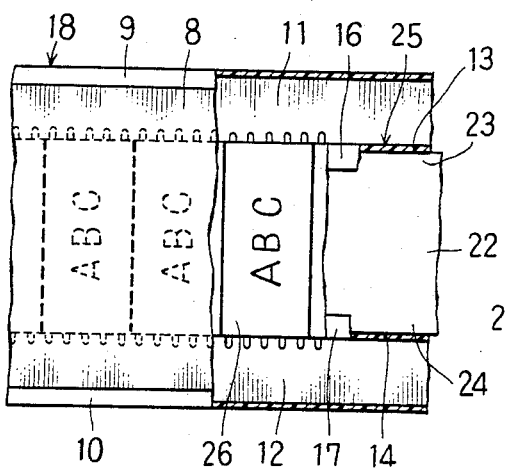
FIG. 2 is a partly enlarged plan view, partly cutaway, of that embodimnet.
Figure 3:
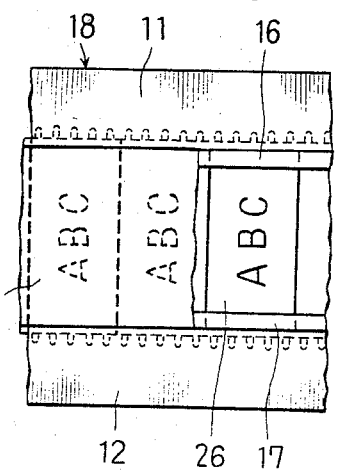
FIG. 3 is a partly enlarged bottom view, partly cutaway, of that embodiment.
Figure 4:
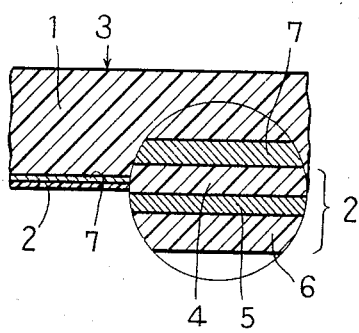
FIG. 4 is a partly enlarged section of the conductive substrate sheet, a part of which is further enlarged.

Referring now to FIGS. 1 to 4 inclusive, synthetic resins such as polyester, polycarbonate, polyvinyl chloride, polystyrene, polyethylene, polypropylene, etc. contain 0.1 to 0.5% by weight of an antistatic agent comprising a surface active agent based on an alkyl benzene sulfonic acid such as an alkyl benzene sulfonate, an amine salt such as a triethanol amine salt, or a phosphate such as ethanol phosphate, thereby to prepare a hard synethetic resin sheet 1 which has a specific resistivity of $10^{10}$–$10^{12}$ ohm/cm$^2$, a thickness of 0.1 to 1.0 mm and a transparency, of at least 60% and possesses shape retention.

Alternatively, that sheet may not contain the antistatic agent. Then, that sheet 1 is laminated over the inner surface, or over the inner and outer surfaces, with a light-transmitting, conductive thin layer or layers 2 which has or have a surface conductivity of no higher than $10^6$ ohm/cm$^2$, thereby to prepare a conductive substrate sheet 3. That conductive thin layer 2 is prepared by laminating a light-transmitting metallized layer 5 of 30 to 200 Å in thickness, including a metal such as indium oxide, tin oxide, chromium or nickel or an alloy thereof, over one side of a transparent film 4 of synethetic resins such as polyethylene, polyvinyl chloride, polystyrene, nylon, etc., and applying over the surface of the film 5 a tranparent protective coating 6 formed of synthetic resins such as acrylic resin. With the protective coating or coatings 6 turned outside, the conductive thin layer or layers 2 is or are bonded over the inner surface or the outer and inner surfaces of the hard synthetic resin sheet 1 by means of an isocyanate adhesive 7. The thus obtained conductive sheet substrate 3 has a transparency of no less than 60%, a surface conductivity of no higher than $10^6$ ohm/cm$^2$ and an electrostatic shielding property, and shows shape retention at the time of bending at normal temperature.

With the conductive thin layer turned inside, the conductive substrate sheet 3 is bent, by roll forming plural times along the lengthwise direction thereof to form an upper section 8 and outer side sections 9 and 10 depending from the right and left outer ends thereof. Inwardly extending bottom sections 11 and 12 are then formed at the lower ends of the depending outer sections 9 and 10, and left and right upright inner sections 13 and 14 are formed at the inner ends of the bottom sections 11 and 12. Inwardly extending pieces 16 and 17 for resting an integrated circuit thereof are formed at the upper ends of the left and right upright inner sections 13 and 14, while keeping a gap 15 therebetween, thereby to form a covering member 18.

Synthetic resin such as polyester, polycarbonate, polyvinyl chloride, polystyrene, polyethylene, polyprpylene or the like contain an antistatic agent comprising a surface active agent used on an alkyl sulfonate such as an alkylbenzene sulfonate, a surface active agent based on an amine salt such as triethanol amine salt, or a surface active agent based on a phosphate such as a phosphite or ethanol phosphate in an amount of 0.1 to 0.5% by weight to form a hard synthetic resin band-like sheet 19 having a specific resistivity of $10^{10}$–$10^{12}$ ohm/cm$^2$, a thickness of 0.1 to 1.0 mm and a transparency of at least 60%. That sheet may not contain the aforesaid antistatic agent. With the use of an isocyanate adhesive, a conductive thin layer or layers 20 similar to the conductive thin layer or layers 2 having a light transmitting property and a surface conductivity of no more than $10^6$ ohm/cm$^2$ is or are bonded over the inner side or the inner and outer sides of that sheet 19 to thereby form a conductive band-like lining sheet 22 having a transparency of no less than 60%, a surface conductivity of no less than $10^6$ ohm/cm$^2$ and an electrostatic shielding property.

With the aforesaid conductive layer 20 turned inside (upper face), the left and right pieces 16 and 17 are bonded at the lower faces to both side edges 23 and 24 of the sheet 22 by high-frequency fusing, ultrasonic fusing or a bonding agent to connect a resting piece 25 with the aforesaid covering member 18.

Figure 5:
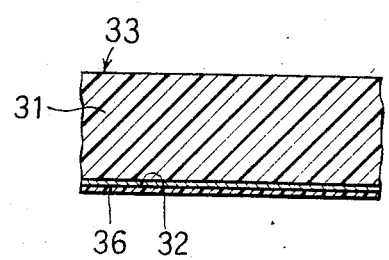
FIG. 5 is a partly enlarged section of another conductive substrate sheet.

In another embodiment of the present invention illustrated in FIG. 5, prepared is a transparent and hard synthetic resin sheet 31 which may or may not contain 0.1 to 0.5% by weight of a antistatic agent, is formed of polyester, polycarbonate, polyvinyl chloride, polypropylene, polyethylene, polystyrol, etc., shows shape retention with respect to bending, and has a thickness of 0.1 to 1.0 mm. This sheet is formed at one or both sides with a conductive thin layer or layers 32, which, like the foregoing one or ones, is or are formed directly of a metallized layer having a light transmitting property and a thickness of 20 to 200 Å by suitable metallizing means. The conductive thin layer 32 is formed on the surface with a 1 to 10 micron-thick transparent protective coating film 36 of acryl resin for preventing oxidation and peeling-off thereof by suitable coating means to thereby form a conductive substrate sheet 33. According to the foregoing example, the substrate sheet 33 is formed into the covering member 18 by roll forming, while a conductive band-like lining sheet 22 is obtained according to the manner for preparing the conductive substrate sheet 33, and is formed into a resting member 25, thereby obtaining an IC tube similar to that obtained in the foregoing example. The conductive substrate sheet 33 has a transparency of no less than 60% and a surface conductivity of no more than $10^6$ ohm/cm$^2$. In this figure, reference numeral 26 stands for an integrated circuit.

For distribution, the IC tube according to the present invention, is packed therein with the integrated circuit by slidingly placing it on the resting pieces 16 and 17 of the resting member 25 from the open end thereof, followed by closing of that open end. Upon unpacking it from the tube, the integrated circuit is attached to electronic equipment either automatically or manually.

According to the present invention, when the IC 26 is packed in or unpacked from the tube, the contact area of the IC 26 with the left and right narrow resting pieces 16 and 17 of the resting member 25 is so limited, and the sliding movement of the IC 26 in the tube is so smooth, that the generation of static electricity due to the friction between both is reduced to a minimum. In addition, a slight amount of static electricity, if generated, is rapidly diffused by the covering member 18 having a surface conductivity of no more than $10^6$ ohm/cm$^2$ and the conductive thin layers 2 and 32 applied over the entire inner face, or the entire inner and outer faces, of the resting member 25. The covering member and the thin layers also serve to completely cut off external static electricity, thus protecting the IC 26 against static electricity. Since the covering member 18 and the resting member 25 have a transparency of no less than 60%, it is easy to read, from above or below, assortment markings given on one or both sides of the IC 26 for easy detection and removal of different ICs. Thus, the present invention is suitable for the automatic inspection of ICs 26 and the incorporation of ICs 26 into electonic equipment. Furthermore, due to the shape retention of the hard synethetic resin sheet 1 and 31 forming part of the covering member 18 and the resting member 25, there is no substantial possibility of bending or deforming thereof, thus assuring smooth packing or unpacking ICs 26. The main parts of the IC tube of the present invention can easily be mass-produced by roll forming.

What is claimed is:

1. A tube for integrated circuits, which comprises:
    an electrically conductive substrate sheet formed by laminating an electrically conductive thin layer onto at least one side of a transparent sheet of a synthetic resin, said substrate sheet being bent plural times in a parallel fashion to thereby form an upper section, left and right sections depending therefrom, left and right bottom sections and left and right upright sections spaced away from each other;
    a covering member formed of left and right resting pieces for resting an integrated circuit thereon; and
    an electrically conductive band-like lining sheet formed by laminating an electrically conductive thin layer onto at least one side of a transparent band-like sheet of a synthetic resin;
    said lining sheet being fixedly bonded at both side edges to the lower faces of said resting pieces.

2. The tube as defined in claim 1, in which said both resins are any one of polyester, polycarbonate, polyvinyl chloride, polystyrene, polyethylene and polypropylene.

3. The tube as defined in claim 1, in which said sheets of synthetic resins contain 0.1 to 0.5% by weight of an antistatic agent.

4. The tube as defined in claim 3, in which said sheets of synthetic resins have a surface specific resisitivity of $10^{10}$–$10^{12}$ ohm/cm$^2$.

5. The tube as defined in claim 3, in which said antistatic agent is any one of an alkyl sulfonate base surface active agent, an amine base surface active agent and a phosphate base surface active agent.

6. The tube as defined in claim 1, in which said electrically conductive thin layer is coated on the surface with a transparent protective coating film of an acryl resin, having a thickness of 1 to 10 microns.

7. The tube as defined in claim 6, in which said electrically conductive thin layer is a metallized layer having a thickness of 30 to 200 Å and a surface conductivity of no more than $10^6$ ohm/cm$^2$.

8. The tube as defined in claim 7, in which the metal constituent of said metallized layer is indium oxide, tin oxide, chromium or nickel, or an alloy of a metal selected from such metals.

9. The tube as defined in claim 1, in which said electrically conductive thin layer is a composite obtained by forming a metallized layer having a thickness of 30 to 200 Å and a surface conductivity of no more than $10^6$ ohm/cm$^2$ on at least one side of a transparent synthetic resin film having a thickness of 10 to 20 microns.

10. The tube as defined in claim 9, in which the metal constituent of said metallized layer is indium oxide, tin oxide, chromium or nickel, or an alloy of a metal selected from such metals.

11. The tube as defined in claim 1, in which said electrically conductive substrate sheet and said electrically conductive band-like lining sheet have a transparency of at least 60%.

12. The tube as defined in claim 1, in which said electrically conductive substrate sheet and said electrically conductive band-like lining sheet have at least one sides of no more than $10^6$ ohm/cm$^2$ in surface conductivity.

13. The tube as defined in claim 1, in which said electrically conductive substrate sheet and said electrically conductive band-like lining sheet have a thickness of 0.1 to 1.0 mm.

14. The tube as defined in claim 1, in which said electrically conductive substrate sheet is bent plural times in a parallel fashion by roll forming.

15. The tube as defined in claim 1, in which said lining sheet being fixedly bonded at both side edges to the lower faces of said resting pieces by any one high-frequency fusing, ultrasonic fusing and a bonding agent.

* * * * *